US011675315B2

(12) United States Patent
Saito

(10) Patent No.: US 11,675,315 B2
(45) Date of Patent: Jun. 13, 2023

(54) SOLAR PANEL, DISPLAY, AND TIMEPIECE

(71) Applicant: CASIO COMPUTER CO., LTD., Tokyo (JP)

(72) Inventor: Yuta Saito, Tachikawa (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 495 days.

(21) Appl. No.: 16/816,818

(22) Filed: Mar. 12, 2020

(65) Prior Publication Data

US 2020/0310356 A1 Oct. 1, 2020

(30) Foreign Application Priority Data

Mar. 26, 2019 (JP) .............................. JP2019-057775

(51) Int. Cl.
*G04C 10/02* (2006.01)
*H01L 31/0468* (2014.01)
*H02S 40/36* (2014.01)

(52) U.S. Cl.
CPC .......... *G04C 10/02* (2013.01); *H01L 31/0468* (2014.12); *H02S 40/36* (2014.12)

(58) Field of Classification Search
CPC ...... G04C 10/02; H01L 31/0468; H02S 40/36
See application file for complete search history.

(56) References Cited

U.S. PATENT DOCUMENTS

| 2002/0157700 | A1* | 10/2002 | Ito | G04C 10/02 |
| | | | | 257/E31.038 |
| 2008/0225039 | A1* | 9/2008 | Oshita | G04G 9/08 |
| | | | | 345/418 |

FOREIGN PATENT DOCUMENTS

| EP | 1 126 337 A1 | 8/2001 |
| EP | 2 109 149 A1 | 10/2009 |
| JP | 2001-267604 A | 9/2001 |
| JP | 2001264464 A | 9/2001 |
| JP | 2001267603 A | * 9/2001 |
| JP | 2016-066654 A | 4/2016 |
| WO | 00/31596 A1 | 6/2000 |

(Continued)

OTHER PUBLICATIONS

Shoji, JP 2001267603 A, English Machine Translation, pp. 1-16. (Year: 2001).*

(Continued)

*Primary Examiner* — Tae-Sik Kang
(74) *Attorney, Agent, or Firm* — Scully, Scott, Murphy & Presser, P.C.

(57) ABSTRACT

There is provided a solar panel including: a plurality of solar cells each of which is formed in a belt-shape extending in a predetermined direction on a plate-shaped surface and which is disposed in rows in a cell-width direction perpendicular to an extending direction of the plurality of solar cells; and a partition area that divides the plurality of solar cells from each other. The plurality of solar cells has, across at least two of the plurality of solar cells, a transparent power generation area which corresponds at least to a visible area seen from an outside and in which a power generation area and a transparent area that transmits light are alternately disposed and extend in the extending direction. In the transparent power generation area, the partition area is formed in a belt-shape having a width equal to a width of the transparent area.

10 Claims, 4 Drawing Sheets

(56) References Cited

FOREIGN PATENT DOCUMENTS

WO         2012/060246 A1     5/2012

OTHER PUBLICATIONS

Extended European Search Report dated Jul. 17, 2020 received in European Patent Application No. EP 20165199.9.
Notice of Reasons for Refusal dated Feb. 2, 2021 received in Japanese Patent Application No. JP 2019-057775 together with an English language translation.
Notice of Reasons for Refusal dated Jan. 4, 2023 received in Japanese Patent Application No. JP 2021-126388.
Notice of Reasons for Refusal dated Apr. 4, 2023 received in Japanese Patent Application No. JP 2021-126388.

\* cited by examiner

SOLAR PANEL, DISPLAY, AND TIMEPIECE

CROSS-REFERENCE TO RELATED APPLICATIONS

This application is based upon and claims the benefit of priority from the prior Japanese Patent Application No. 2019-057775, filed on Mar. 26, 2019, the entire contents of which are incorporated herein by reference.

BACKGROUND

Technical Field

The technical field relates to a solar panel, a display apparatus, and a timepiece.

Description of the Related Art

Display apparatuses with a solar panel that receives light to generate electric power, such as timepieces, have been widely known in the art. Such timepieces generate electric power with a solar panel to charge their secondary battery, and this enables a long-time use without changing a battery.

For example, with a solar panel, a wrist watch or the like can be convenient timepiece that does not require changing its battery.

For example, JP 2001-267604 A discloses formation of a solar cell on a substrate with light transparency, in a shape of a narrow linear body so as not to block most of the transparency of the substrate.

SUMMARY

A solar panel reflecting one embodiment includes:

a plurality of solar cells each of which is formed in a belt-shape extending in a predetermined direction on a plate-shaped surface and which is disposed in rows in a cell-width direction perpendicular to an extending direction of the plurality of solar cells; and a partition area that divides the plurality of solar cells from each other;

wherein the plurality of solar cells has, across at least two of the plurality of solar cells, a transparent power generation area which corresponds at least to a visible area seen from an outside and in which a power generation area and a transparent area that transmits light are alternately disposed and extend in the extending direction, wherein in the transparent power generation area, the partition area is formed in a belt-shape having a width equal to a width of the transparent area.

DESCRIPTION OF THE EMBODIMENT

An embodiment of a solar panel and a timepiece as a display apparatus using the solar panel is described with reference to FIGS. 1 to 5.

Figure 1:
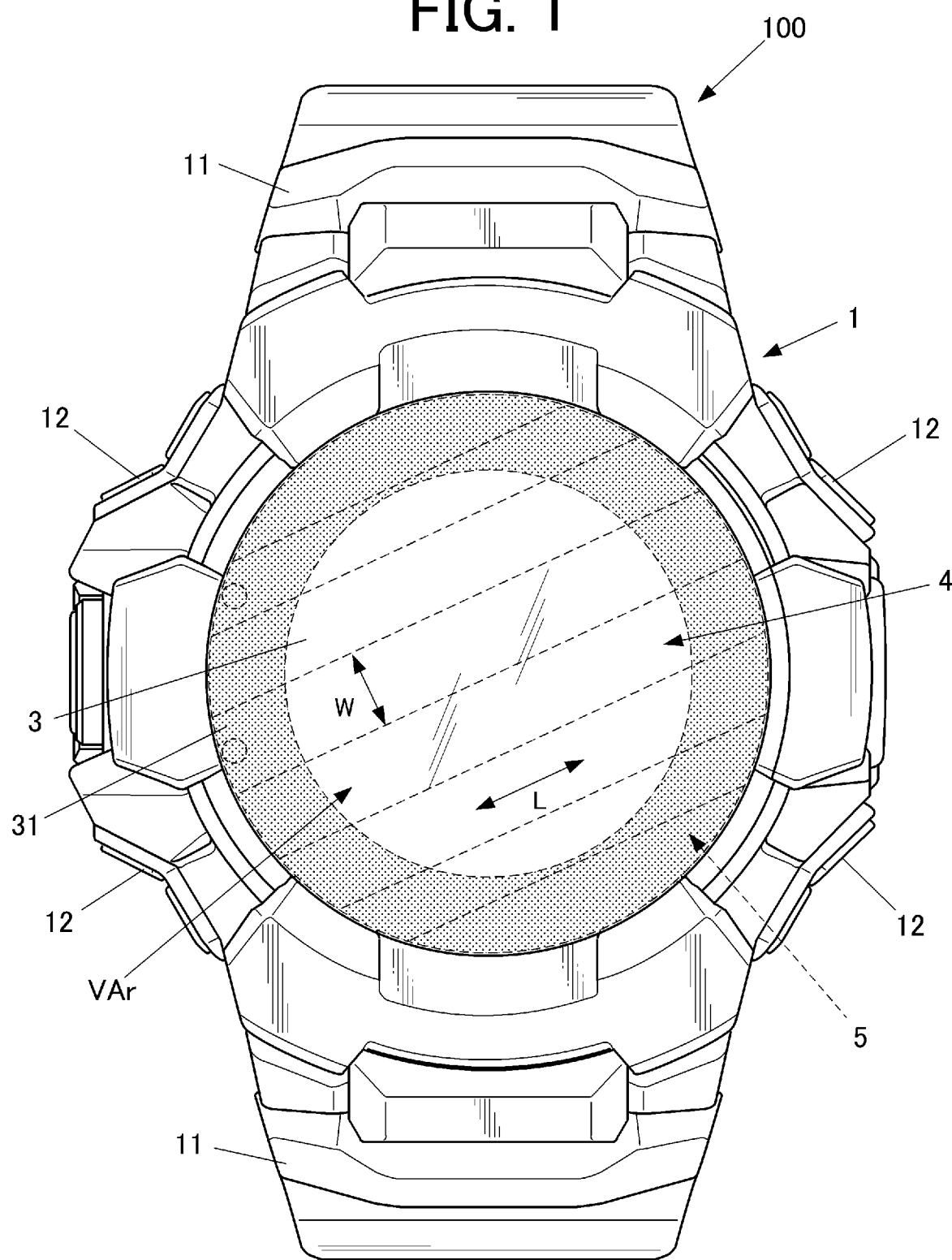
FIG. 1 is a front view of a timepiece in an embodiment.

FIG. 1 is a front view of the timepiece as the display apparatus in this embodiment.

As shown in FIG. 1, the timepiece 100 in this embodiment includes a case (hereinafter referred to as a "timepiece case 1" in this embodiment). The timepiece case 1 is formed of a hard material such as a hard synthetic resin and a metal (ex. titanium and stainless steel (SUS)). The material of the timepiece case 1 is not limited to those exemplified herein.

The timepiece case 1 in this embodiment is formed in a shape of a hollow short column that opens up and down in the thickness direction of the case (front and back in the timepiece).

Belt attaching parts 11 are provided at the upper and lower ends of the timepiece case 1 in FIG. 1, that is, at the ends around positions of 12 o'clock and 6 o'clock. To the belt attaching parts 11, a timepiece belt(s) is attached.

The timepiece 100 includes an operation button(s) 12 on the lateral side or the like of the timepiece case 1. In the example shown in FIG. 1, four push buttons, two at the left and right ends respectively, are disposed as the operation buttons 12 in the timepiece case 1.

A windshield member 3 with light transparency that is made of transparent glass or the like is formed at the opening on the front surface side of the timepiece case 1 to cover the opening.

A back cover not shown in the drawings is formed on the back surface of the timepiece case 1 to close the opening.

The outer periphery on the lower surface (the surface disposed inside the timepiece case 1) side of the windshield member 3 is a ring-shaped decorative part 31 in this embodiment. The decorative part 31 is decorated all over with pattern, coloring, and the like by a method that does not block light transparency and provided with characters, symbols, scales, and the like such as various kinds of logos.

The decorative part 31 has a function as a blindfold that covers a connecting part of the outer periphery of the display 4, the solar panel 5, and the like housed in the timepiece case 1 so as not to be seen from the outside.

The method of forming the decorative part 31 is not particularly limited, and, for example, printing, vapor deposition, or the like is performed on the lower surface of the windshield member 3.

The decorative part 31 is not limited to one that is provided by printing or the like on the lower surface of the windshield member 3. For example, as another member beside the windshield member 3, an exterior member, a bezel, or the like on the lower or upper side of the windshield member 3 may be a decorative part that functions as blindfold of the outer periphery of the display or the like. The decorative part has light transparency also in that case.

A module to operate each component of the timepiece 100 as the display apparatus (a timepiece module including a time measurement circuit as a timing unit to execute clock processing) is housed inside the timepiece case 1 in this embodiment.

A display 4 including a liquid crystal panel (not shown in the drawings) is disposed between the module and the windshield member 3 over the module (on the surface side, the view side of the timepiece). The display elements of the liquid crystal panel or the like may be of a reflective type or a transparent type.

Though omitted from FIG. 1, the time and various kinds of information are displayed on the display 4.

The configuration of the display 4 is not particularly limited, and may include an analog display method including a clock face, hands, and the like. The display 4 may also include both a digital display method including a liquid crystal panel or the like and an analog display method.

As described above, the outer periphery of the display 4 (peripheral edge or the like) is covered with the decorative part 31 and not seen from the outside.

In this embodiment, the area surrounded by the decorative part 31 (the area almost circular in white shown in FIG. 1) is a visible area VAr that is visible from the outside in the display 4.

A solar panel 5 is disposed between the display 4 and the windshield member 3. The solar panel 5 is formed of multiple cells, as shown in dashed lines in FIG. 1, and overlaid on the view side of the display 4 (on the surface side of the timepiece 100).

Figure 2:
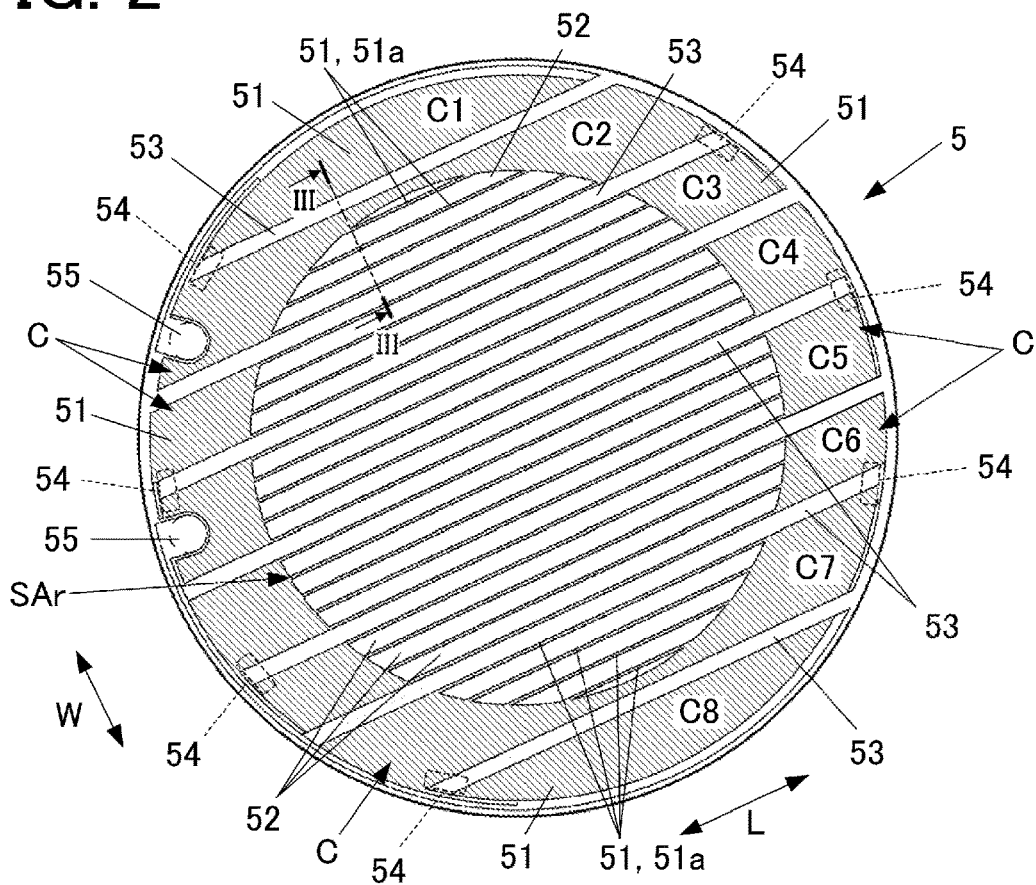
FIG. 2 is a plan view of a solar panel in the embodiment.

FIG. 2 is a plan view of a solar panel in the embodiment.

The solar panel 5 includes a power generation area 51 (including a thin-line power generation area 51a) that functions as a solar cell receiving light to generate power. The power generated by the solar panel 5 using photovoltaic power generation is stored in the secondary battery (not shown in the drawings).

As shown in FIG. 2, the solar panel 5 in this embodiment includes solar cells C formed in a belt-shape extending therein in the planar direction. The solar cells C are arranged in rows in the cell-width direction W perpendicular to the extending direction L.

The solar cells C are divided from each other by partition areas 53. In this embodiment, the partition areas 53 are formed in a belt-shape in a width equal to the width of the transparent areas 52 (described later) from an end to the other in the extending direction L.

The solar panel 5 includes connecting parts 54 that respectively connect the solar cells C with each other electrically in series at respective ends of the solar cells C in the extending direction L.

The connecting parts 54 are disposed across the partition areas 53 that divide the solar cells C from each other.

The solar panel 5 is configured integrally by the solar cells C that are connected with each other at the connecting parts 54.

In this embodiment, the connecting parts 54 are disposed outside the visible area VAr and not seen from the outside.

The solar panel 5 includes two terminals 55. One of the terminals 55 is electrically connected to a positive electrode on the base board (not shown in the drawings) of the module, and the other one of the terminals 55 is electrically connected to a negative electrode on the base board.

The positioning of the terminals 55 is not particularly limited, but they are respectively disposed at the ends of the solar cells C2 and C4 in FIG. 2, for example.

In this embodiment, the number of the solar cells C of which the solar panel 5 is composed is not particularly limited. In FIG. 2, the solar panel 5 is composed of eight solar cells C (C1 to C8 in FIG. 2) that are connected in series, for example.

As the number of the solar cells C that are connected in series is larger, the voltage of the solar panel 5 as a whole is higher. Thus, the number of the solar cells C of which the solar panel 5 is composed is suitably determined according to the level of the necessary voltage such as the voltage of the secondary battery storing the power generated by the solar panel 5.

At least part of the solar cells C (the solar cells C1 to C8) include a transparent power generation area SAr in which the power generation areas 51 and the transparent areas 52 are alternately disposed to extend in the extending direction L.

In this embodiment, at least part of the solar cells C corresponding to the visible area VAr (described above) that is seen from the outside is configured as the transparent power generation area SAr that extends across the multiple solar cells.

The power generation areas 51 in the transparent power generation area SAr are disposed at equal intervals.

Specifically, some of the power generation areas 51 that are disposed in the transparent power generation area SAr are the thin-line power generation areas 51a formed in a thin-line with a width smaller than that of the transparent area 52.

The thin-line power generation areas 51a are disposed in the transparent power generation area SAr at intervals. This makes the surface uniformly bright as a whole when the display 4 is viewed from the outside, even with the solar cells C being disposed on the upper side of the display 4, and thus the thin-line power generation areas 51a are prevented from being noticeable. This can realize good visibility of the display 4 and a high-quality appearance.

The "generation areas 51" used in the embodiments include both the thin-line power generation area 51a and the other power generation areas 51.

The thinness of the thin-line power generation areas 51a (the length in the cell-width direction W) is not particularly limited, but it is about 10 μm in a case where the thinness of the transparent areas 52 (the length in the cell-width direction W) is about 70 μm.

As the width of the thin-line power generation areas 51a (the length in the cell-width direction W) is smaller (thinner) and the width of the transparent areas 52 (the length in the cell-width direction W) is larger (thicker), the solar panel 5 in the transparent power generation areas SAr is more transparent, improving the visibility of the visible area VAr of the display 4. In contrast, as the width of the thin-line power generation areas 51a is smaller, the power generation amount is smaller, and the resistance of the movement of electric charges in the solar cell C is higher, deteriorating the power generation efficiency.

Thus, the widths of the thin-line power generation areas 51a and the transparent areas 52 are suitably determined to balance the visibility desired for the visible area VAr of the display 4 (that is, the extent of transparency of the transparent power generation area SAr corresponding to the visible area VAr) and the power generation amount and efficiency desired for the solar panel 5.

As the multiple solar cells C are connected in series to form the single solar panel 5, a gap in the output current value between the solar cells C results in decrease of the current value of the solar panel 5 in accordance with the current value smallest of the solar cells C.

Thus, in order to improve the power generation efficiency, the sizes of the power generation areas 51 of the solar cells C are preferably as equal as possible.

The sizes of the solar cells C1 and C8 that respectively have the power generation areas 51 almost all over are smaller, and the sizes of the solar cells C4 and C5 that largely correspond to the transparent power generation area SAr and that have more of the thin-line power generation areas 51a are comparatively larger, as shown in FIG. 2. Accordingly, the sizes of the whole power generation areas 51 including the thin-line power generation areas 51a are adjusted to be equal in each of the solar cells C1 to C8, in this embodiment.

In a case where part of the power generation areas 51 is covered with a member having low transparency, for example, with a logo made of a metal as part of the decorative unit 31, the power generation amount of the power generation areas 51 is decreased at the part with lower transparency.

In a case where the positioning intervals of the thin-line power generation areas 51a in the transparent power generation area SAr are changed so as to resolve that, the appearance and the visibility are affected by noticeable stripes, for example.

Thus, the shapes of the power generation areas 51 outside the transparent power generation area SAr (the power generation areas 51 outside the part corresponding to the visible area VAr) may be changed, for example, so as to equalize the sizes of the power generation areas 51 between the solar cells C. In that case, the solar cells C may be in a shape tapered at an end, in a shape swelling at an end, or in a curved shape. That is, the overall shape of the solar cells C may not be in a flawless belt-shape or a strip-shape as shown in the drawings of this embodiment.

The power generation areas 51 outside the part corresponding to the visible area VAr (the power generation areas 51 outside the transparent power generation area SAr) have a smaller size of the transparent areas 52 than the transparent power generation area SAr, and have a higher power generation density compared to the transparent power generation area SAr. Thus, the power generation areas 51 outside the part corresponding to the visible area VAr look shaded overall.

As in this embodiment shown in FIG. 2, the power generation areas 51 with a high power generation density is used on the periphery of the timepiece 100 on the view side corresponding to the decorative part 31. This allows the decorative part 31 to function as a blindfold to cover the periphery or the wiring of the module below the solar panel 5.

Figure 3:
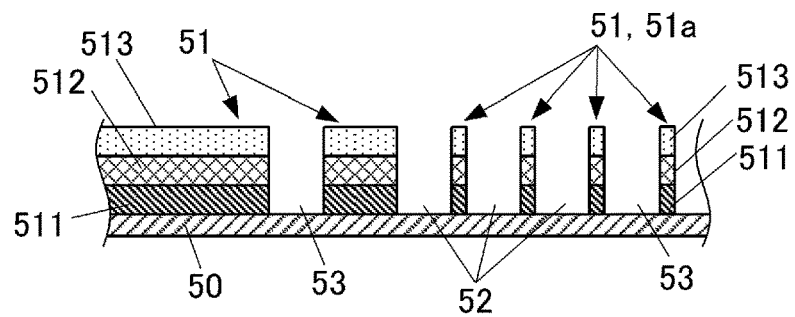
FIG. 3 is a cross-sectional view of the solar panel taken along a line III-III in FIG. 2.

FIG. 3 is a cross-sectional view of the solar panel taken along the line III-III in FIG. 2.

As shown in FIG. 3, the solar panel 5 includes, on the base board 50, the power generation areas 51, the transparent areas 52, and the partition areas 53 to divide the solar cells C from each other.

Among those, the power generation areas 51 has a layered structure. In the power generation area 51, a back surface electrode 511 is formed on the base board 50, and a semiconductor layer 512 and a transparent electrode 513 are further layered thereon in the written order. A transparent sealing material (protection layer) may be formed on the layered structure to cover the base board 50 all over.

The transparent areas 52 and the partition areas 53 have the base board 50 only, without the back surface electrode 511, the semiconductor layer 512, or the transparent electrode 513.

The transparent areas 52 and the partition areas 53 may be formed by areas in which the back surface electrode 511, the semiconductor layer 512, and the transparent electrode 513 are not layered on the base board 50. Alternatively, after the back surface electrode 511, the semiconductor layer 512, and the transparent electrode 513 are layered on the base board 50, those layers may be partly removed to form the transparent areas 52 and the partition areas 53. The back surface electrode 511 may be removed by any method. For example, a laser processing may be used.

The base board 50 is a thin plate with transparency, and may be a flexible film of transparent plastic, for example. The material of the base board 50 may be transparent resin, glass, and the like, but is not limited to the examples shown in this embodiment.

The back surface electrode 511 includes a metal material such as aluminum conductor, for example. The material of the back surface electrode 511 is not limited to this example.

The semiconductor layer 512 is formed of amorphous silicon (a-Si:H), for example. A semiconductor of a p-n junction type that is formed by joining p-type and n-type semiconductor materials may be used as the semiconductor layer 512, for example.

The back surface electrode 511 and the semiconductor layer 512 are layered on the base board 50 by vapor deposition, for example. The method of forming the back surface electrode 511 and the semiconductor layer 512 on the base board 50 is not limited to the examples described here.

The transparent electrode 513 is formed by crystallizing zinc oxide, indium oxide, tin oxide, or the like. The material or method of formation of the transparent electrode 513 is not limited to these examples.

The semiconductor layer 512 does not function as the power generation area 51 unless it is between the back surface electrode 511 and the transparent electrode 513. Thus, as shown in FIG. 4, the semiconductor layer 512 may be left on the base board 50 in the partition areas 53 (see the partition area 53 on the left side of FIG. 4).

In a case where the semiconductor layer 512 left on the base board 50 is not transparent, it is visible from the outside.

Figure 4:
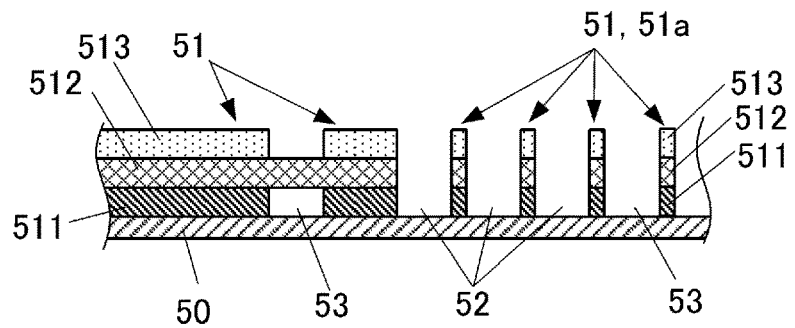
FIG. 4 is a cross-sectional view of a variation of FIG. 3.

Thus, in that case, in the transparent power generation area SAr, the back surface electrode 511, the semiconductor layer 512, and the transparent electrode 513 need to be all removed even in the partition areas 53 (see the partition area 53 between the thin-line power generation areas 51a on the right side of FIG. 4).

Figure 5:
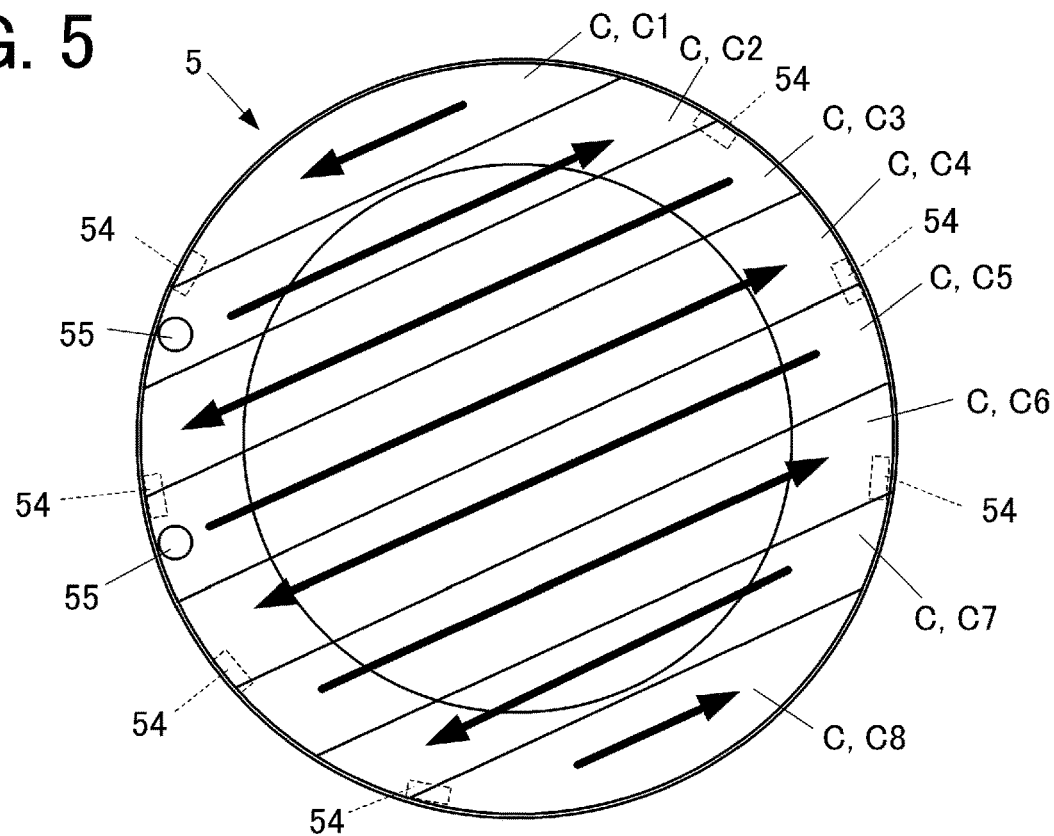
FIG. 5 is an explanatory drawing of an example of the moving direction of electric charges in the solar panel shown in FIG. 2.

FIG. 5 is an explanatory drawing schematically showing an example of the moving direction of electric charges in this embodiment.

In this embodiment, the connecting parts 54 to connect the solar cells C with each other are alternately disposed at one of the opposite ends in the extending direction L so that charges are alternately moved from one end to the other in the extending direction L of the solar cells C from the solar cells C1 to C8, as shown in FIG. 5.

The arrangement and configuration shown in FIG. 5 is merely an example, and all the connecting parts 54 are not necessarily alternately disposed at one of the opposite ends in the extending direction L. The connecting parts 54 need to be alternately disposed at one of the opposite ends in the extending direction L in a case where the solar cells C having at least partly the transparent power generation area SAr extending over the entire cell width are continuously disposed.

For example, in this embodiment, the transparent power generation area SAr extends over the entire cell width W at the central part in the extending direction L of the solar cells C3 to C6 among the solar cells C.

This causes the power generation areas 51 outside the transparent power generation area SAr to be separated at the opposite ends of the solar cells C.

In the solar cells C3 to C6 as described above, electric charges that are generated in the power generation areas 51 including the thin-line power generation areas 51a and moved along the extending direction L necessarily pass through the thin-line power generation areas 51a. In the solar panel 5, the moving path of electric charges is necessarily narrow in a case where the power generation areas 51 are thin lines, because the solar panel 5 is also thin in the thickness direction. When electric charges that are generated in the power generation areas 51 pass through, the electric resistance value is larger than in the power generation areas 51 that are not thin lines, which results in electric losses.

Thus, the connecting parts 54 are alternately disposed at one of the opposite ends in the extending direction L so that charges are not moved back and forth (for the moving distance of charges to be as small as possible) and that charges are moved in one direction. That is effective in regard of reducing electric losses.

In contrast, in the solar cells C1, C2, C7, and C8, the power generation areas 51 that are not the thin-line power generation areas 51a (the power generation areas 51 that are adequately wide in the cell-width direction W) are continuously disposed from one end to the other in the extending direction L.

Accordingly, in the solar cells C1, C2, C7, and C8, large electric losses due to resistance are not caused in a case where electric charges that are generated in the power generation areas 51 including the thin-line power generation areas 51a are moved in the extending direction L.

Thus, the connecting part 54 to connect the solar cell C1 and the solar cell C2, the connecting part 54 to connect the solar cell C2 and the solar cell C3, the connecting part 54 to connect the solar cell C6 and the solar cell C7, and the connecting part 54 to connect the solar cell C7 and the solar cell C8 may be disposed at the ends on the same side in the extending direction L.

In this embodiment, as shown in FIG. 1, the solar panel 5 is disposed such that the extending direction L of the solar cells C1 to C8 of the solar panel 5 are oblique to the vertical (the up-down direction in FIG. 1, 12 o'clock to 6 o'clock direction in the analog timepiece) and horizontal (the left-right direction in FIG. 1, 3 o'clock to 9 o'clock direction in the analog timepiece) directions of the timepiece 100.

As shown in this embodiment, in a case where the display 4 of the timepiece 100 as the display apparatus is a digital type display including a liquid crystal panel or the like, the vertical or horizontal arrangement direction of the display elements of the liquid crystal panel or the like are usually the vertical or horizontal direction of the timepiece 100.
The extending direction L is the grid arrangement direction of the thin-line power generation areas 51a and the transparent areas 52 in the transparent power generation area SAr in the solar panel 5. In a case where the extending direction L coincides with the arrangement direction of the display elements, moiré fringes are likely to be caused, significantly deteriorating the visibility of the display 4.

To avoid this, the solar panel 5 is disposed at such an angle that the arrangement direction of the display elements of the liquid crystal panel or the like and the extending direction L of the solar cells C are intersecting. This can prevent moiré fringes caused due to the correlation with the display 4. Specifically, the angle formed by the arrangement direction of the display elements and the extending direction L of the solar cells C is most preferably 25 degree or 65 degree, and may be 15 degree to 75 degree, to prevent moiré fringes.

In this embodiment, the solar panel 5 is disposed in the direction shown in FIG. 1 so that the cell-width direction W, which is the arrangement direction of the solar cells C1 to C8, does not coincide with the horizontal direction of the timepiece 100 (the left-right direction in FIG. 1, 3 o'clock to 9 o'clock direction in the analog timepiece).

In a case where the timepiece 100 is a wristwatch as shown in FIG. 1, part of the power generation areas 51 on the opposite side from the finger tips may be covered by the hem of the sleeve depending on the length of the sleeve of the clothe of the user, when the timepiece 100 is put on by the user. In a case where the arrangement direction of the solar cells C1 to C8 coincides with the horizontal direction of the timepiece 100 here, the power generation amount in part of the solar cells C is extremely decreased, and the power generation efficiency of the solar panel 5 as a whole may be significantly reduced.

In contrast, the arrangement direction of the solar cells C1 to C8 and the horizontal direction of the timepiece 100 are intersecting in this embodiment. This can prevent part of the solar cells C from losing the power generation function at all even if the power generation areas 51 of the timepiece 100 are partially covered with the sleeve or the like.

In a case where, part of the solar cells C being covered with the sleeve or the like, the power generation amounts of the solar cells C1 to C8 are decreased almost equally, the power generation amount of the solar panel 5 as a whole is decreased. However, compared to the case where part of the power generation amount of the solar cells C are extremely decreased, the power generation amount can be prevented from decreasing as much as possible.

Next, the actions of the solar panel 5 and the timepiece 100 as the display apparatus including the solar panel 5 in this embodiment are described.

The solar panel 5 is mounted on the upper side of the display 4 that is disposed on the view side of the timepiece 100 in this embodiment. The solar panel 5 is disposed such that the transparent power generation area SAr corresponds to the visible area VAr of the display 4.

The transparent power generation area SAr is configured by the thin-line power generation areas 51a and the transparent areas 52 being aligned in the longitudinal direction. This can prevent the visibility of the display 4 from deteriorating even with the solar panel 5 being disposed on the upper side of the display 4 and can maintain the power generation areas 51 on the upper side of the display 4. Accordingly, the power generation amount can be increased in comparison to the case where the power generation areas are disposed on the peripheral part of the display 4 only.

The solar pane 5 is disposed such that the extending direction L of the solar cells C1 to C8 are oblique to the vertical (the up-down direction in FIG. 1, 12 o'clock to 6 o'clock direction in the analog timepiece) and horizontal (the left-right direction in FIG. 1, 3 o'clock to 9 o'clock direction in the analog timepiece) directions of the timepiece 100.

In a case where the display 4 is of a dot-matrix type in which the display elements are arranged in line in a predetermined direction, for example, in a case where the display 4 is configured by the liquid crystal panel or the like and the horizontal or vertical arrangement direction of the display elements is the horizontal or vertical direction of the timepiece 100, and where the extending direction L of the solar cells C1 to C8 coincides with a predetermined direction (the vertical or horizontal direction of the timepiece 100), overlapping of the transparent power generation amount SAr of the solar panel 5 and the liquid crystal panel or the like may cause moiré fringes.

In this regard, as the extending direction L of the solar cells C1 to C8 is oblique to the predetermined direction at a predetermined angle, moiré fringes caused by overlapping of the transparent power generation area SAr of the solar panel 5 and the liquid crystal panel or the like can be suppressed.

As the solar panel 5 is disposed on the view side of the timepiece 100, which is the upper side of the display as well, the electric power is efficiently generated in the power generation areas 51 of the solar cells C1 to C8 in a case where light enters through the windshield member 3. The solar cells C are connected by the connecting parts to form the single solar panel 5, and the electric power generated by the solar panel 5 as a whole is stored in the secondary battery. Then, the electric power is supplied from the secondary battery to the components such as the motor of the module, and the timepiece 100 is driven thereby.

As described above, according to this embodiment, the solar cells C that are formed in a belt-shape extending in the planar direction are arranged in rows in the cell-width direction perpendicular to the extending direction L. At least the part of the solar cells C corresponding to the visible area VAr that is seen from the outside is formed as the transparent power generation area SAr in which the power generation areas 51 and the transparent areas 52 that transmits light are alternately arranged in the extending direction L. The partition areas 53 are formed in a belt-shape having a width equal to that of the transparent areas 52.

As described above, the visibility can be ensured even in the case where the solar panel 5 is disposed on the upper side of the display 4 because the part corresponding to the visible area VAr is the transparent area SAr.

The part dividing the solar cells C is not noticeable when viewed from the outside, and fringes are not noticeable even in the case where the solar panel 5 is formed of the multiple solar cell C, realizing excellent appearance, because the partition areas 53 have a width equal to that of the transparent areas 52.

A larger amount of electric power can be generated, because the power generation areas 51 (the thin-line power generation areas 51a in this embodiment) can be disposed on the surface side of the timepiece 100 that can easily receive light.

According to this embodiment, the power generation areas 51 in the transparent power generation area SAr are disposed at equal intervals.

As the power generation areas 51 are arranged at equal intervals, and a grid structure is not noticeable when the solar panel 5 is viewed from the outside. As fringes are not noticeable even with the power generation areas 51 being overlaid on the visible area VAr, the appearance can be good.

According to this embodiment, the part outside the visible area VAr in the solar cells C is in the power generation areas 51.

Thus, a larger amount of electric power can be generated at the part that is not seen from the outside and does not affect the appearance, and good appearance and excellent power generation capacity can be both obtained.

According to this embodiment, the power generation areas 51 disposed in the transparent power generation area SAr are the thin-line power generation areas 51a that are thinner in width than the transparent areas 52.

Thus, even in the case where the power generation areas 51 are overlaid on the part corresponding to the visible area VAr, the visibility of the display 4 is not deteriorated, and the appearance can be improved.

According to this embodiment, the partition areas 53 are narrower in width than the transparent area 52 at the part outside the visible area VAr.

Thus, the power generation amount can be increased by increase of the size of the power generation areas 51 at the part that is not seen from the outside and does not affect the appearance. In that way, good appearance and excellent power generation capacity can be both obtained.

In the case where the solar panel 5 in this embodiment is used for the timepiece 100 as the display apparatus, the visibility of the display 4 can be ensured and the power generation efficiency of the solar panel 5 can be improved.

Thus, the timepiece 100 (display apparatus) on which the time and various kinds of functions are displayed with good visibility can be realized, and a sufficient amount of electric power can be generated by the solar panel 5 even in a case where the timepiece 100 includes a function unit requiring a lot of electric power.

In the timepiece 100 (display apparatus) including the solar panel 5 according to this embodiment, the solar panel 5 is overlaid on the view side of the display 4, and the transparent power generation area SAr is disposed at the part corresponding to the visible area VAr that is seen from the outside on the display 4.

Thus, the visibility is not deteriorated even in the case where a larger amount of electric power is generated by the solar panel 5, and the timepiece 100 (display apparatus) in which the display 4 is clearly visible can be realized.

Although an embodiment of the present invention is described above, needless to say the present invention is not limited to the embodiment and can be appropriately modified in a variety of aspects without departing from the scope of the present invention.

For example, in the embodiments described above, the partition areas 53 that divide the solar cells C from each other are formed in the width of the transparent areas 52 from one end to the other in the extending direction L of the solar cells C, as shown in FIG. 2. However, the shape or the like of the partition areas 53 are not limited to this example.

Figure 6:
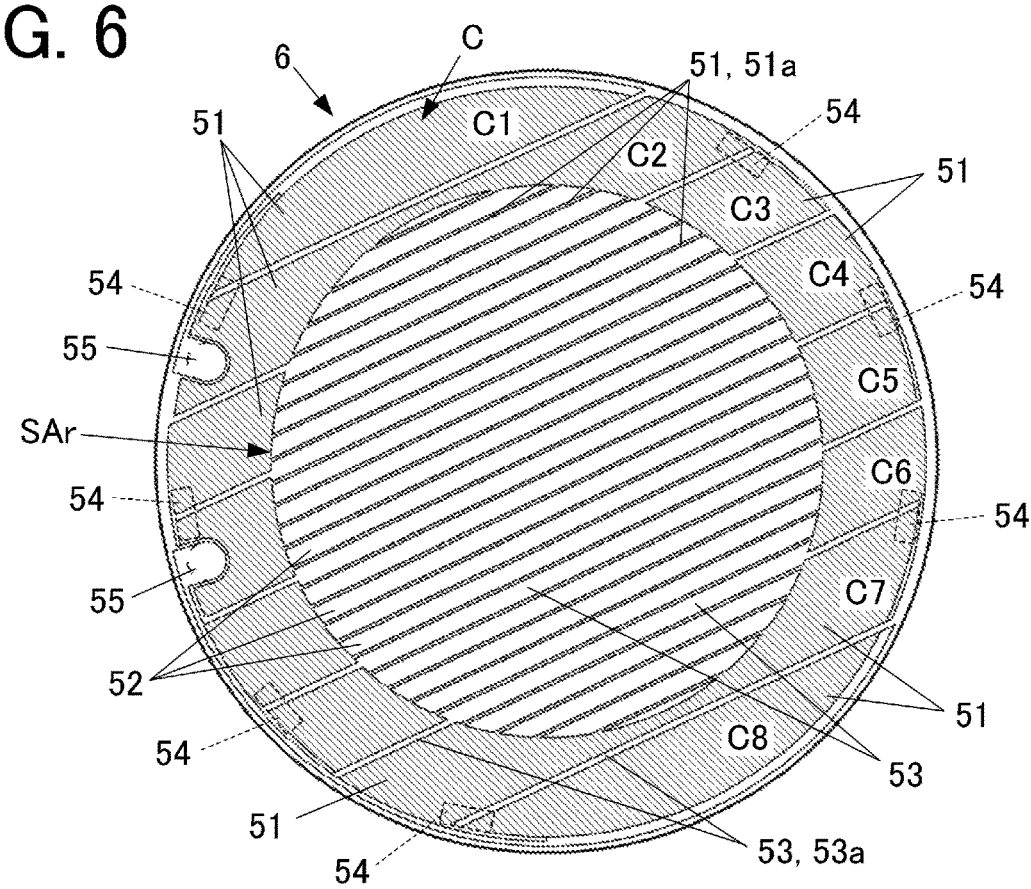
FIG. 6 is a plan view of a variation of the solar panel.

For example, as in the solar panel 6 shown in FIG. 6, the part outside the transparent area SAr in the solar cells C (the part corresponding to the part outside the visible area), the partition areas 53 may be reduced in width and be made into narrow partition areas 53a.

The width of the part of the partition areas 53 outside the transparent power generation area SAr does not need to be the same as the width of the part inside the transparent power generation area SAr, because the part outside the transparent power generation area SAr is not seen from the outside and does not affect the appearance.

In that case, as the partition areas 53 is made into the thin partition areas 53a, the size of the power generation areas 51 is increased, and a larger amount of electric power can be generated.

In this embodiment, the part of the solar cells C that corresponds to the central part of the solar panel 5 only is the transparent power generation area SAr. However, the range of the transparent power generation area SAr is not limited to this example.

Figure 7:
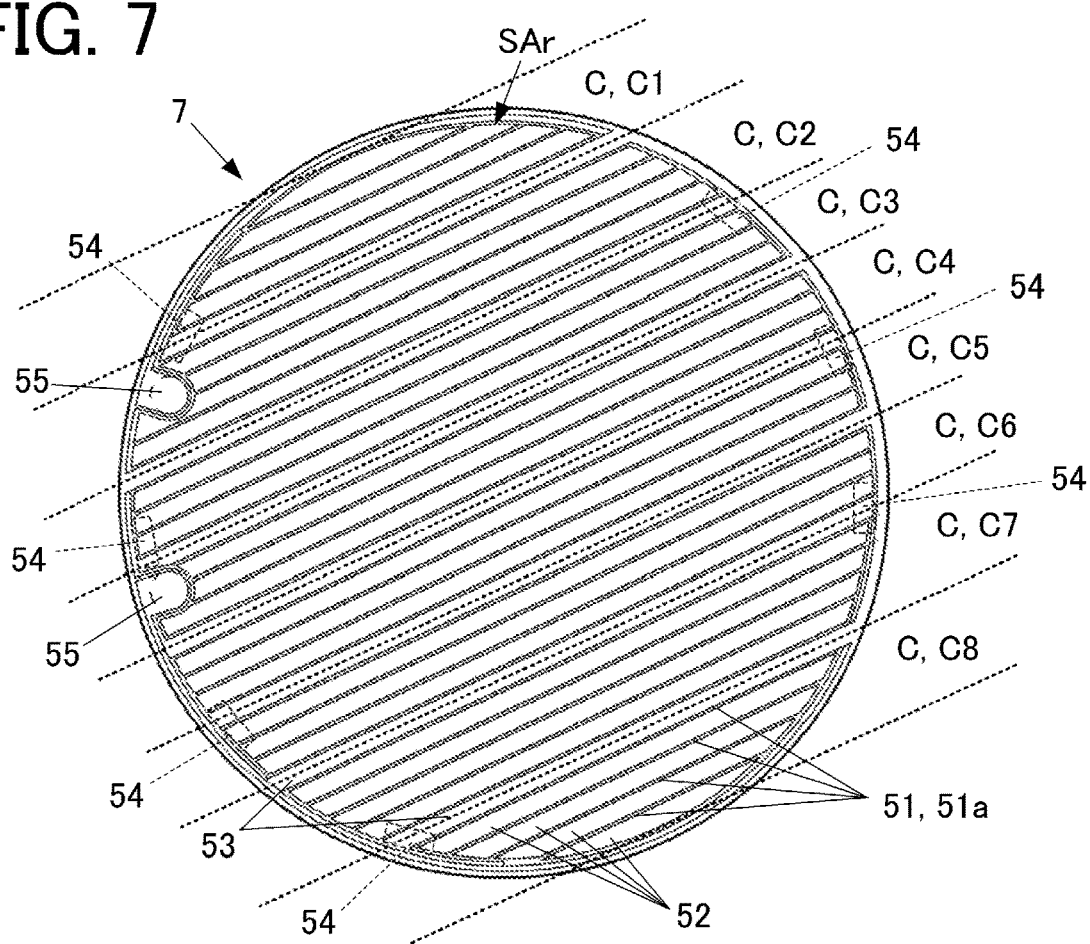
FIG. 7 is a plan view of a variation of the solar panel.

For example, as in the solar panel 7 shown in FIG. 7, the whole of the solar cells C1 to C8 (that is, the entire solar panel 7) may be the transparent power generation area SAr.

For example, in a case where the decorative part 31 is absent and the visible area VAr of the display 4 is wide, the transparent power generation area SAr corresponding to the visible area VAr needs to be made wider so that the visibility of the display 4 is secured.

In that case, as shown in FIG. 7, in the solar cells C1 to C8, the whole parts from one end to the other in the extending direction L are the thin-line power generation areas 51*a*, and the electric resistance value in movement of charges is even higher.

To avoid this, as in this embodiment, the connecting parts 54 that connect the solar cells C with each other are alternately disposed at one of the opposite ends in the extending direction L so that charges are alternately moved from one end to the other, from the solar cell C1 to the solar cell C8, in the extending direction L of the solar cells C, and are prevented from being moved back and forth.

As a result, the moving distance of charges can be as short as possible, and electric losses due to increase in the electric resistance value when charges pass through are reduced. The power generation efficiency can be kept high.

In the case where the whole of the solar cells C1 to C8 (that is, the entire solar panel 7) are the transparent power generation area SAr, the transparent areas 52 may also be the partition areas 53.

In that case, as shown in dashed lines in FIG. 7, being divided along the extending direction L, a half of the partition area 53 belongs to one solar cell C (for example, the solar cell C1) and the other half to the adjoining solar cell C (for example, the solar cell C2).

The shapes of the solar panel and the solar cells thereof are not limited to circles in the embodiments described above.

Figure 8:
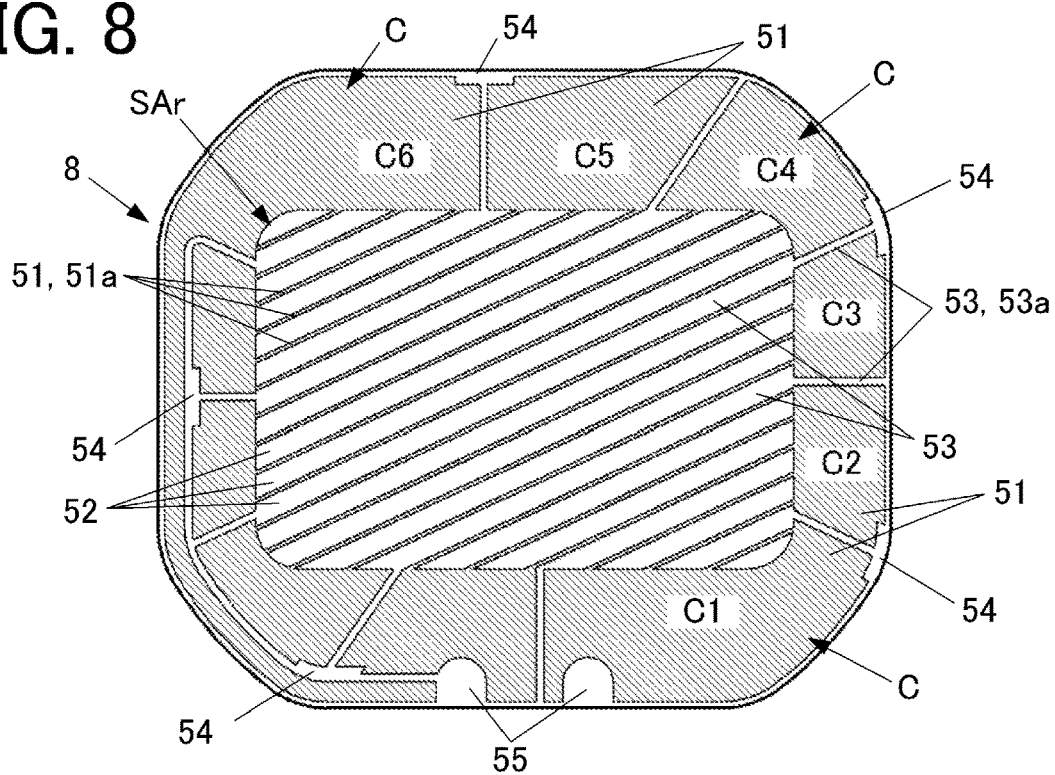
FIG. 8 is a plan view of a variation of the solar panel.

For example, they may be oval, or polygonal as in the solar panel 8 in FIG. 8, which is octagonal.

The solar panel 8 is composed of six solar cells C1 to C6 as shown in FIG. 8, for example. However, the number of the solar cells C of which the polygonal solar panel 8 is composed is not limited to this example.

In that case, too, the part of the display 4 corresponding to the visible area VAr is the transparent power generation area SAr.

The solar cells C1 to C6 are each divided by the partition areas 53 (including the thin partition areas 53*a*) such that each of the power generation areas 51 (including the thin-line power generation areas 51*a*) has an almost equal size.

As the solar panel can be in any shape, the solar panel according to the present invention can be applied for the timepiece 100 (display apparatus) having the display 4 in various shapes.

The solar panel 5 is incorporated in the timepiece 100 in this embodiment, as an example. However, the solar panel 5 can be incorporated in any kinds of apparatuses.

The solar panel 5 can be widely incorporated in display apparatuses that are driven by electric power generated by the solar panel 5, for example, in a biological information display device such as a pedometer, a heartbeat meter, or a pulse meter, a display device that displays various kinds of information such as moving distance, moving pace information, altitude information, barometric pressure information, and the like.

Although one or more embodiments have been described, the scope of the present invention is not limited to the embodiments and includes the scope of claims below and the scope of their equivalents.

What is claimed is:

1. A solar panel comprising:
   a plurality of solar cells each of which is formed in a belt-shape extending in an extending direction on a plate-shaped surface and which is disposed in rows in a cell-width direction perpendicular to the extending direction of the plurality of solar cells; and
   a partition area that divides the plurality of solar cells from each other,
   wherein each of at least two of the plurality of solar cells comprises:
      a plurality of thin-line power generation areas extending in the extending direction and disposed in rows in the cell-width direction, wherein adjacent thin-line power generation areas of the each of the at least two of the plurality of solar cells are separated by a transparent area that transmits light, and wherein the plurality of thin-line power generation areas and the transparent area of the at least two of the plurality of solar cells form a transparent power generation area; and
      an other power generation area connecting the plurality of thin-line power generation areas outside of the transparent power generation area, and
   wherein at least a portion of the partition area that divides the at least two of the plurality of solar cells in the transparent power generation area has a width in the cell-width direction equal to a width of the transparent area in the cell-width direction.

2. The solar panel according to claim 1, wherein in the transparent power generation area, the thin-line power generation areas of each of the at least two of the plurality of solar cells are arranged at an equal interval.

3. The solar panel according to claim 1, wherein another portion of the partition area away from the transparent power generation area has a width in the cell-width direction narrower than the width of the transparent area in the cell-width direction.

4. The solar panel according to claim 2, wherein another portion of the partition area away from the transparent power generation area has a width in the cell-width direction narrower than the width of the transparent area in the cell-width direction.

5. A display apparatus comprising:
   the solar panel according to claim 1; and
   a display.

6. The display apparatus according to claim 5, wherein the display is of a dot matrix type in which display elements are arranged in a predetermined arrangement direction, and
   wherein the extending direction of the plurality of solar cells is oblique to the predetermined arrangement direction at a predetermined angle.

7. The display apparatus according to claim 5, wherein the solar panel is overlaid on a view side of the display, and
   wherein the transparent power generation area is disposed in a part corresponding to a visible area that is seen from the outside in the display.

8. A timepiece comprising:
   the solar panel according to claim 1;
   a display; and
   a timing unit that performs clock processing.

9. The timepiece according to claim 8, wherein the display is of a dot matrix type in which display elements are arranged in a predetermined arrangement direction, and
   wherein the extending direction of the plurality of solar cells is oblique to the predetermined arrangement direction at a predetermined angle.

10. The timepiece according to claim 8, wherein the solar panel is overlaid on a visible side of the display, and wherein the transparent power generation area is disposed in a part corresponding to a visible area that is seen from the outside in the display.

\* \* \* \* \*